US008144164B2

(12) United States Patent
Watanabe

(10) Patent No.: US 8,144,164 B2
(45) Date of Patent: Mar. 27, 2012

(54) IMAGE DISPLAY APPARATUS AND METHOD

(75) Inventor: Tomoki Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 605 days.

(21) Appl. No.: 12/393,270

(22) Filed: Feb. 26, 2009

(65) Prior Publication Data

US 2009/0219296 A1 Sep. 3, 2009

(30) Foreign Application Priority Data

Feb. 28, 2008 (JP) ................................ 2008-047919

(51) Int. Cl.

| | |
|---|---|
| ***G06F 3/038*** | (2006.01) |
| ***G09G 5/10*** | (2006.01) |
| ***G09G 5/00*** | (2006.01) |
| ***H04N 5/04*** | (2006.01) |
| ***H04N 5/57*** | (2006.01) |
| ***G06K 9/40*** | (2006.01) |
| ***G06K 9/00*** | (2006.01) |
| *H04N 9/64* | (2006.01) |
| *G03F 3/08* | (2006.01) |
| *H04N 1/46* | (2006.01) |

(52) U.S. Cl. ........ 345/589; 345/204; 345/213; 345/606; 345/691; 348/500; 348/602; 348/687; 348/719; 358/518; 358/525; 358/448; 382/162; 382/254; 382/274; 382/276

(58) Field of Classification Search .................. 345/426, 345/428, 581, 589, 600, 606, 619, 204, 207, 345/690–691, 213, 48, 63, 77–79, 89; 348/254, 348/469, 500, 602, 536–538, 687, 719; 358/518–525, 448, 461; 382/162, 167, 254, 382/260, 276, 300

See application file for complete search history.

(56) References Cited

U.S. PATENT DOCUMENTS

| | | | | |
|---|---|---|---|---|
| 6,980,177 | B2 | 12/2005 | Struyk | |
| 2009/0009850 | A1 * | 1/2009 | Shirai et al. | 359/292 |
| 2010/0085373 | A1 * | 4/2010 | Miyasaka et al. | 345/589 |
| 2010/0128225 | A1 * | 5/2010 | Nishino et al. | 353/31 |

FOREIGN PATENT DOCUMENTS

| | | |
|---|---|---|
| JP | 06-118927 | 4/1994 |

* cited by examiner

*Primary Examiner* — Wesner Sajous

(74) *Attorney, Agent, or Firm* — Turocy & Watson, LLP

(57) ABSTRACT

A display image of a frame is input in time series. An inverse colored image to cancel the display image is generated. The display image is divided into a plurality of subfields, and the inverse colored image is also divided into a plurality of subfields. A time divisional image is generated by disposing a display time of a subfield of the inverse colored image before and after a display time of a corresponding subfield of the display image. While displaying the time divisional image on a screen, a light from the screen is transmitted in synchronization with display timing of the display image in a display time of the time divisional image, and the light is cut off in synchronization with display timing of the inverse colored image in the display time of the time divisional image.

12 Claims, 6 Drawing Sheets

IMAGE DISPLAY APPARATUS AND METHOD

CROSS-REFERENCE TO RELATED APPLICATIONS

This application is based upon and claims the benefit of priority from Japanese Patent Application No. 2008-47919, filed on Feb. 28, 2008; the entire contents of which are incorporated herein by reference.

FIELD OF THE INVENTION

The present invention relates to an apparatus and a method for displaying an image by concealing the image from the third party's viewing.

BACKGROUND OF THE INVENTION

By widely spreading a mobile device such as a personal computer, a cellular-phone, and a portable video player, the mobile device is used in public space frequently. In this case, anyone can peep the screen of the mobile device. Accordingly, the use of the mobile device in the public place includes problem for security and privacy.

In JP-A H06-118927 (KOKAI), technique for concealment of visual information is proposed. As to this technique, an image to be concealed (Hereafter, it is called "display image") and an image having inverse color of the display image (it is called "inverse colored image") are mutually displayed on a screen with time division. By canceling the display image with after-image of the inverse colored image, the display image is concealed for the third party. On the other hand, as for the user side of the mobile device, optical transparence is changed by combining a polarizing direction switching unit with a polarizing filter. The polarizing direction switching unit switches a polarizing direction from the screen in synchronization with time division timing of the display image. Concretely, the user can peruse the display image on the screen on which the image is time-divisionally displayed.

However, when the user peruses a dynamic image on the image display apparatus disclosed in JP-A H06-118927 (KOKAI), a part having brightness largely changed with passage of time (for example, a boundary of a moving object) is viewed as bright (or dark) flicker on the screen. As a result, the third party can estimate the display image from this flicker.

Furthermore, when the user peruses a static image, for example, by switching the present image to another image, or by scrolling the image, the above-mentioned phenomenon often occurs.

SUMMARY OF THE INVENTION

The present invention is directed to an image display apparatus and a method for preventing the display image on the screen from the third party estimating information of the display image.

According to an aspect of the present invention, there is provided an apparatus for displaying an image, comprising: an input unit configured to input a display image of a frame; a generation unit configured to generate an inverse colored image to cancel the display image; a time division unit configured to divide the display image into a plurality of subfields, divide the inverse colored image into a plurality of subfields, and generate a time divisional image by disposing a display time of a subfield of the inverse colored image before and after a display time of a corresponding subfield of the display image; an output unit configured to display the time divisional image; and a switching unit configured to transmit a light from the output unit in synchronization with display timing of the display image in a display time of the time divisional image, and cut off the light in synchronization with display timing of the inverse colored image in the display time of the time divisional image.

DETAILED DESCRIPTION OF THE EMBODIMENTS

Figure 1:
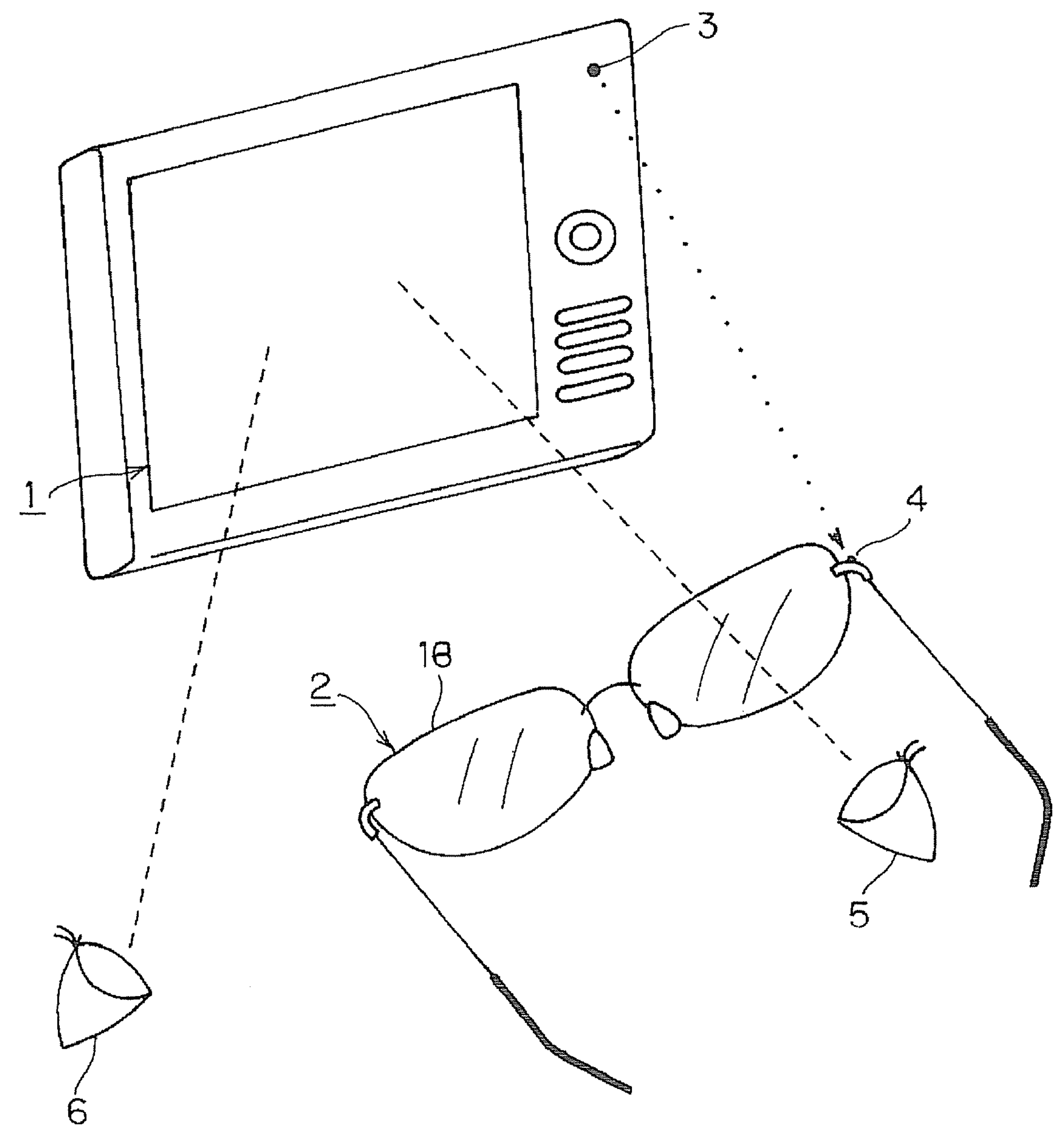
FIG. 1 is a schematic diagram of an exemplary appearance of the image display apparatus according to the first embodiment.

Hereinafter, embodiments of the present invention will be explained by referring to the drawings. The present invention is not limited to the following embodiments.

The First Embodiment

Figure 2:
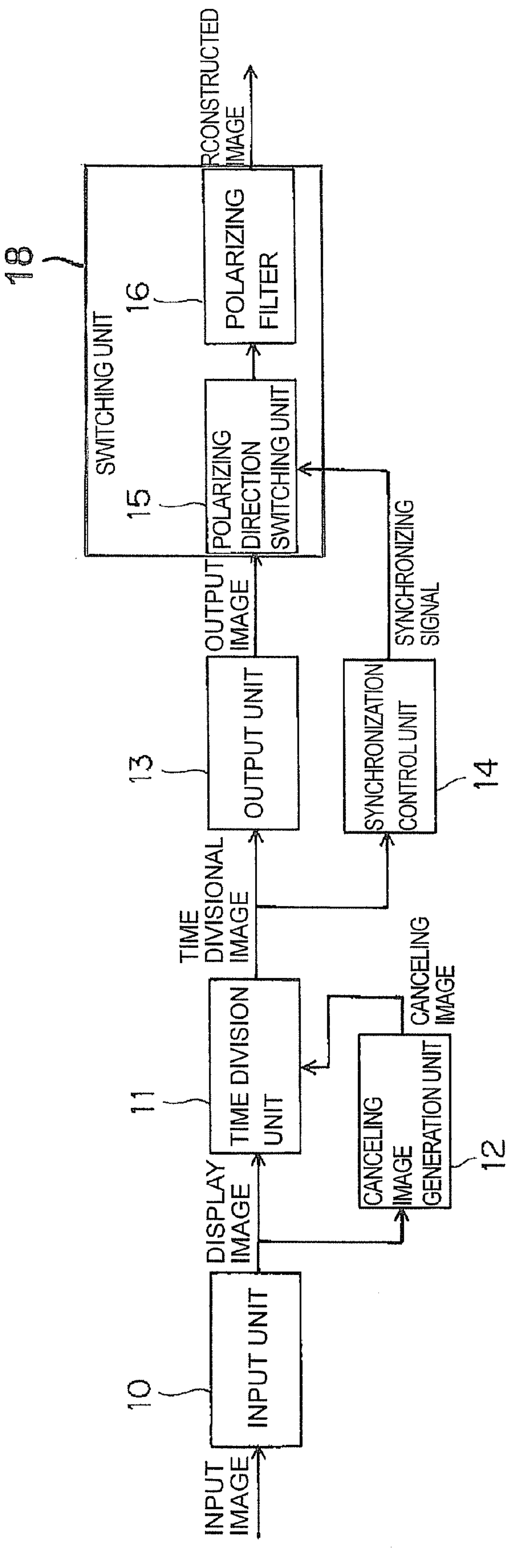
FIG. 2 is a block diagram of the image display apparatus according to the first embodiment.

The image display apparatus of the first embodiment is explained by referring to FIGS. 1~5. First, component of the image display apparatus is explained by referring to FIGS. 1 and 2. FIG. 1 is an exemplary appearance of the image display apparatus, and FIG. 2 is a block diagram of the image display apparatus.

The image display apparatus includes a main body 1 and glasses (spectacles) 2. In FIG. 2, the main body 1 includes an input unit 10, a time division unit 11, a canceling image generation unit 12, an output unit 13, and a synchronization control unit 14 (a synchronizing signal transmitter 3 in FIG. 1). The glasses 2 include the synchronization control unit 14 (a synchronizing signal receiver 4 in FIG. 1), and a switching unit 18 (a polarizing direction switching unit 15 and a polarizing filter 16).

The input unit 10 inputs a display image of each frame from the outside. The display image is an image having information to be concealed for the third party. The canceling image generation unit 12 generates a canceling image of each frame from the display image (input to the input unit 10) in order to cancel the display image.

As the canceling image, an inverse colored image of the display image is used. The inverse colored image has all pixels so that a brightness "I" of each pixel on the display image and a brightness "V" of corresponding pixel at the same position on the inverse colored image have the relationship "I+V=1". In this case, the brightness of the darkest pixel is "0" and the brightness of the brightest pixel is "1".

In case of the display image having RGB color, each element of RGB color can be calculated independently. In order to simplify following explanation, the display image has monochrome color.

Furthermore, with regard to a general display, brightness information "i" to be internally stored and brightness "I" to be displayed on a screen have non-linear relationship "$I=i^{\gamma}$" by gamma conversion. In order to display a complementary color on a screen, the supplementary color is calculated after the gamma conversion, and an image to which inverse gamma conversion is subjected need be generated. However, in order to simplify the following explanation, an actual brightness degree on the screen is called "brightness", and explanation of gamma conversion is omitted.

The time division unit 11 divides the display image of one frame into a plurality of subfields, and divides the inverse colored image of one frame into a plurality of subfields. Furthermore, with regard to one subfield of the display image, the time division unit 11 disposes (arranges) a corresponding subfield of the inverse colored image, and outputs a time divisional image. The time divisional image is displayed by the output unit 13. This display method is explained by sectioning a static image and a dynamic image as the display image.

Figure 3:
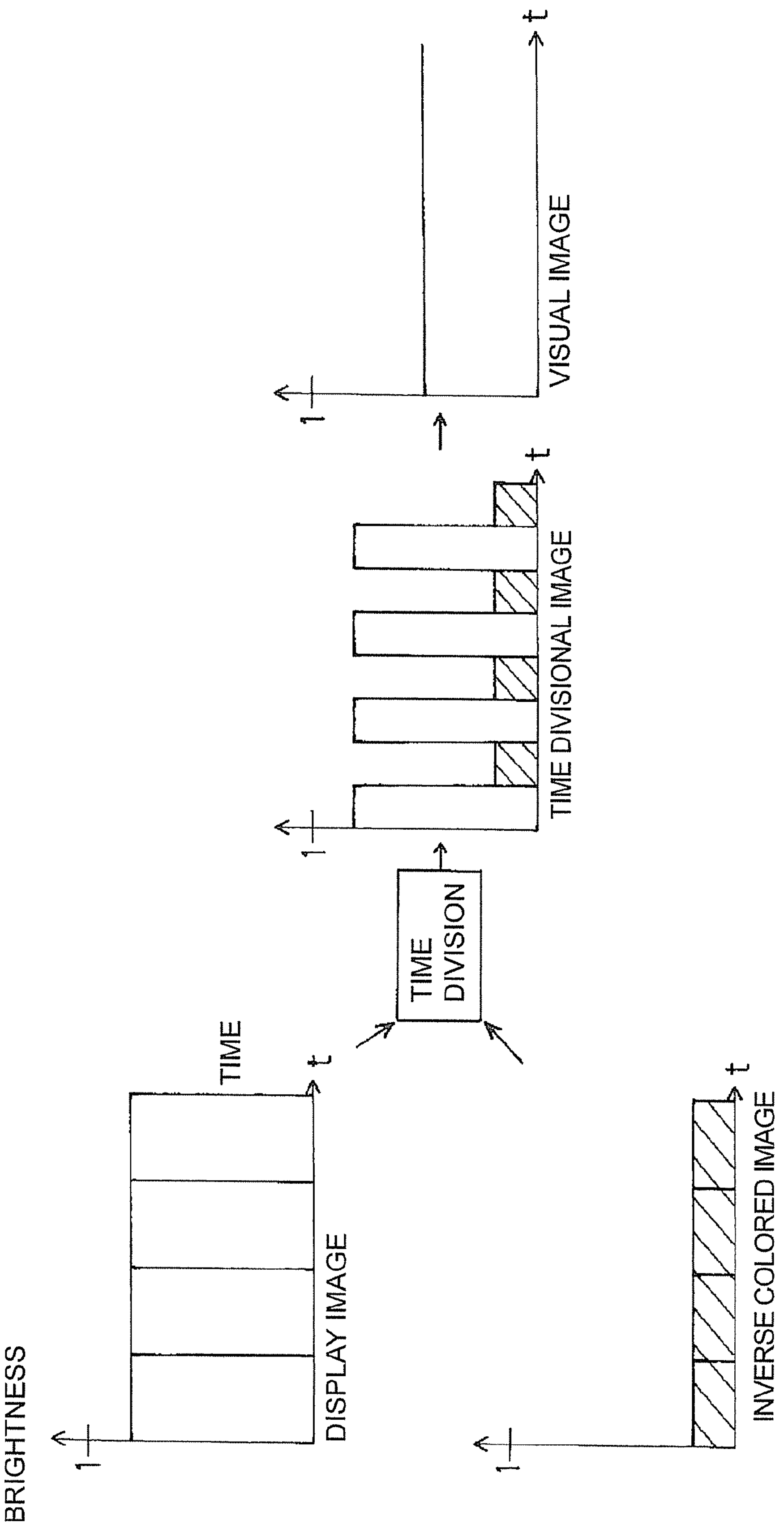
FIG. 3 is a schematic diagram of a graph showing brightness of time divisional images on a screen on which a static image is displayed.

First, the display method for the static image is explained by referring to FIG. 3. In FIG. 3, as to a pixel of arbitrary coordinate on the image, temporal change of brightness of the display image and the inverse colored image, and temporal change of brightness of the time divisional image (generated from the display image and the inverse colored image), are shown.

If display time of subfield is short, while a person is viewing the time divisional image, he/she cannot perceive each subfield, and can perceive an image which a plurality of subfields is added by after-image. As a result, brightness of all pixels of the image is visualized as "0.5", and the third party 6 cannot know the content of the display image.

In this case, the display time of subfield is desirably shorter than 1/120 second. If the display time is shorter, the subfield cannot be more perceived.

On the other hand, by synchronizing switch timing of the polarizing direction switching unit 15 with switch timing of subfield, a user 5 cannot perceive the inverse colored image, and can view the display image only. However, with regard to the dynamic image, problem different from the static image occurs. Hereafter, this problem is explained.

Figure 4:
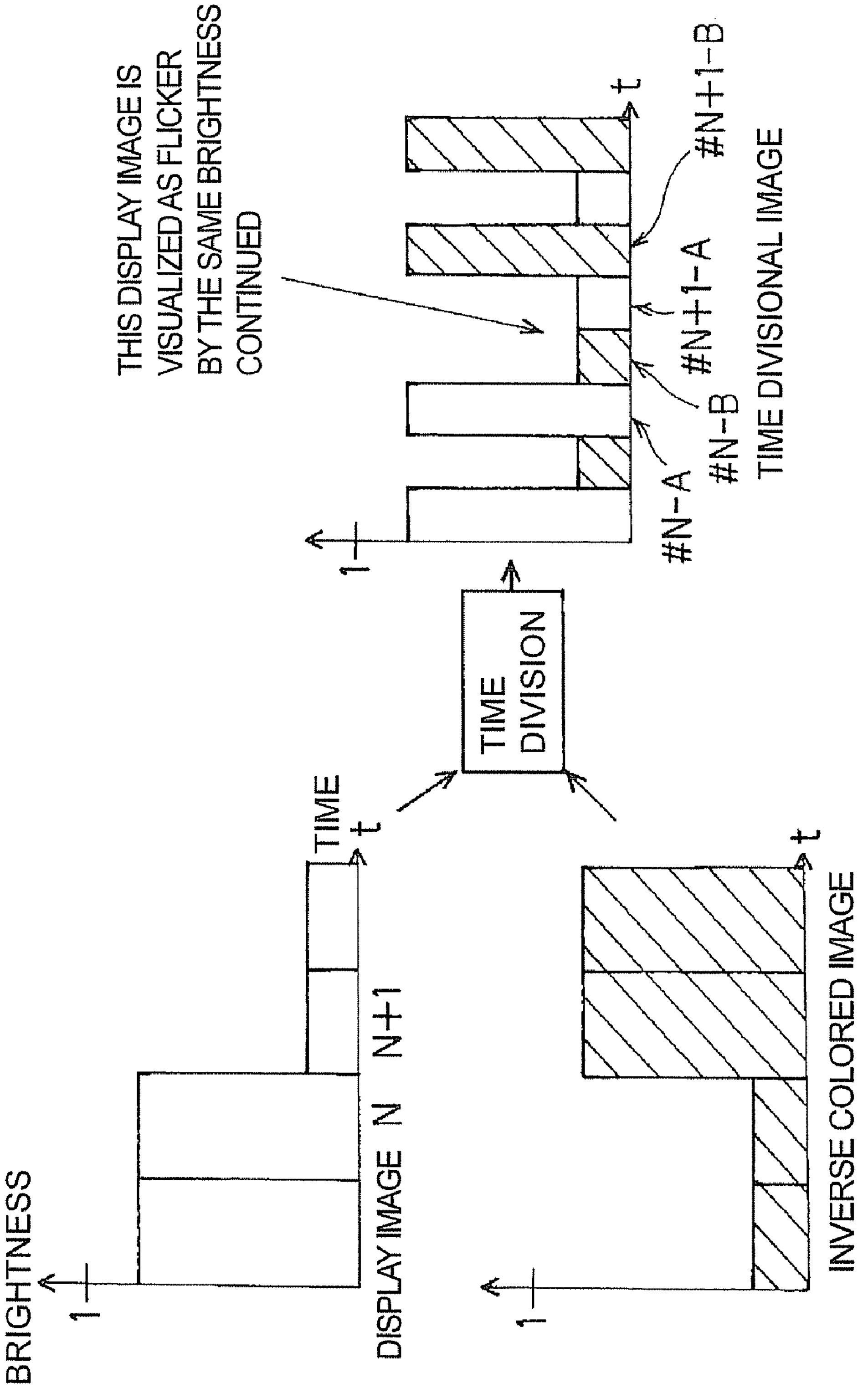
FIG. 4 is a schematic diagram of a graph showing the brightness of time divisional images on a screen on which a dynamic image is displayed.

In case of the dynamic image that brightness of the input image changes with passage of time, the problem is explained by referring to FIG. 4. Assume that brightness of each pixel largely changes between N-th frame and (N+1)-th frame.

First, the conventional technology is explained. Each frame of the display image is divided into two subfields, and corresponding field of the inverse colored image is divided into two subfields. From the head subfield of N-th frame, each subfield is called in order, #N-A display image, #N-B inverse colored image, #N+1-A display image, and #N+1-B inverse colored image. If #N-A display image is bright, #N-B inverse colored image is dark. Furthermore, brightness of #N+1-A display image is largely different from brightness of #N-A display image. Accordingly, #N+1-A display image is dark, and #N+1-B inverse colored image is bright.

Briefly, subfield image is displayed in order of "bright→dark→dark→bright". When subfield images having almost same brightness are continuously displayed, the subfield image can be often perceived as a flicker for a moment by the same brightness of continued subfield images. As a result, the third party may estimate the display image from the flicker.

Figure 5:
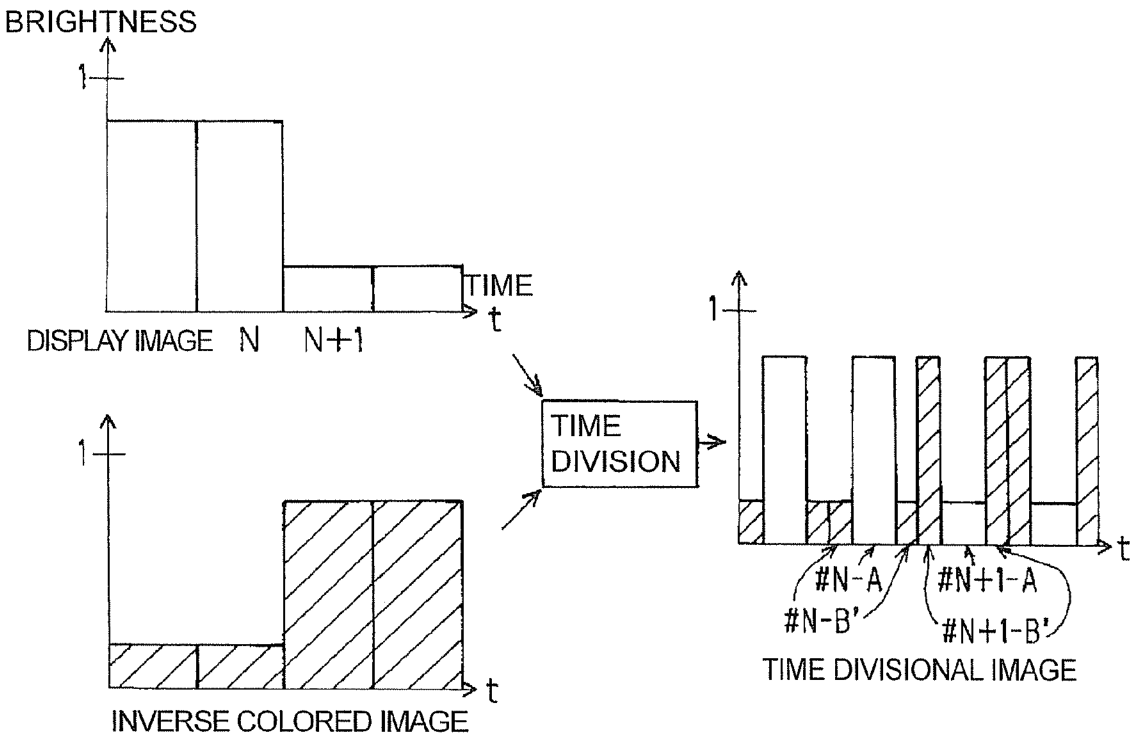
FIG. 5 is a schematic diagram of a graph showing the brightness of time divisional images on condition that time divisional timing is changed according to the first embodiment.

In order to suppress this problem of the conventional technology, a solution method of the present embodiment is explained by referring to FIG. 5. In order to suppress the flicker, a plurality of subfield images having almost same brightness should not be continuously displayed. Accordingly, as shown in FIG. 5, display time of #N-B inverse colored image and display time of #N+1-B inverse colored image are respectively divided. #N-B inverse colored image divided is displayed before and after display time of #N-A display image, and #N+1-B inverse colored image divided is displayed before and after display time of #N+1-A display image. As a result, continuous display of #N-B inverse colored image and #N+1-A display image can be avoided.

Briefly, subfield image having divided display time is respectively represented as #N-B' inverse colored image and #N+1-B' inverse colored image. As shown in FIG. 5, subfield image is displayed in order of "#N-B'→#N-A→#N-B'→#N+1-B'→#N+1-A→#N+1-B'". In this case, division ratio of the display time is not always "½". Furthermore, a subfield image to be divided is not always the inverse colored image.

Next, component of the glasses 2 is explained by referring to FIG. 1. With regard to a lens part of the glasses 2, the polarizing direction switching unit 15 and the polarizing filter 16 are piled up, and transmission and cutting off of light is controlled by switching a polarizing direction of the polarizing direction switching unit 15.

Furthermore, the polarizing direction switching unit 15 synchronizes switch timing of subfield to be displayed on the output unit 13. As the synchronizing method, an extreme infrared radiation or an electronic wave is transmitted from the synchronizing signal transmitter 3 of the synchronization control unit 14, and received by the synchronizing signal receiver 4. Alternatively, the synchronizing signal transmitter 3 and the synchronizing signal receiver 4 may be directly connected by a cable.

When a user 5 wearing the glasses 2 views a display of the output unit 13 of the main body 1, the user 5 perceives the display image. On the other hand, the third party 6 cannot perceive the content of the display image while viewing the display.

The Second Embodiment

Figure 6:
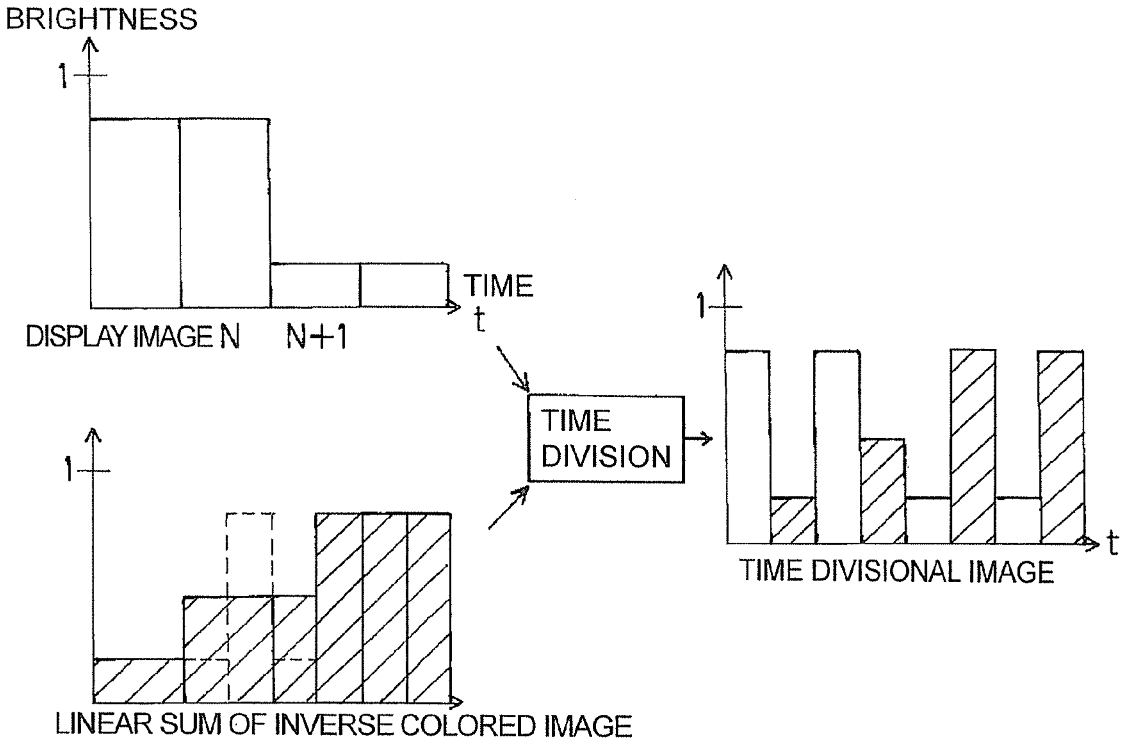
FIG. 6 is a schematic diagram of a graph showing the brightness of time divisional images on condition that canceling image is weighted sum of inverse colored image according to the second embodiment.
Figure 7:
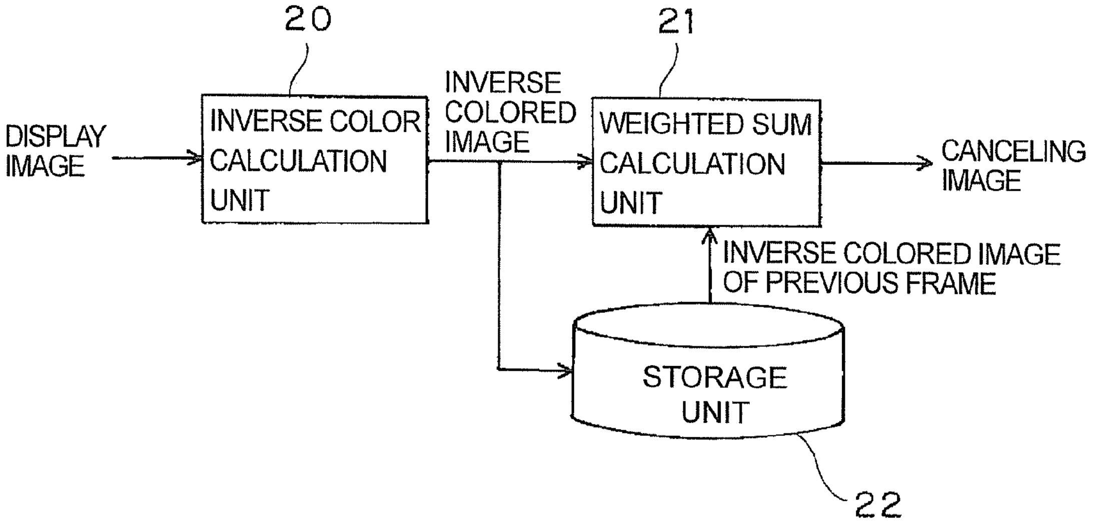
FIG. 7 is a block diagram of a canceling image generation unit 12 according to the second embodiment.

Next, the image display apparatus of the second embodiment is explained by referring to FIGS. 6 and 7. FIG. 6 shows temporal change of brightness in case that a canceling image is generated as a weighted sum of brightness of a plurality of inverse colored images. FIG. 7 is a block diagram of the canceling image generation unit 12. As shown in FIG. 7, the canceling image generation unit 12 includes an inverse color calculation unit 20, a weighted sum calculation unit 21, and a storage unit 22.

With regard to the second embodiment, in order to suppress the flicker, a canceling image is not the inverse colored image of the display image but an image having a weighted sum of brightness of inverse colored images (generated from the display images of a plurality of frames).

By calculating the weighted sum of a plurality of inverse colored images, unnatural image which a plurality of inverse colored images is overlapped is generated. However, with regard to the image display apparatus of the second embodiment, the user 5 cannot view the canceling image. As a result, quality of the display image viewed by the user 5 does not drop.

On the other hand, by properly setting a weight of the weighted sum, brightness of image viewed by the third party with after-image is constantly kept, and continuous display of subfields having almost same brightness can be avoided.

As shown in FIG. 6, the number of frames and the weighted used for the weighted sum are arbitrary. For example, with regard to a subfield of the inverse colored image, two subfields temporarily adjacent before and after the subfield are selected, two inverse colored images are generated from two display images corresponding to the two subfields, and the two inverse colored images are added at a rate "½" respectively.

In order to raise concealment degree of visual information, display time of frame or subfield may be randomly changed or visual information is concealed for a part of the display according to the use purpose. In any cases, the flicker (as a cause to drop the concealment degree) can be suppressed using the weighted sum.

The Third Embodiment

Next, the image display apparatus of the third embodiment is explained. In case that the canceling image is the inverse colored image, the third party 6 can view an entire face of the display as while color, and it is unnatural for the third party 6 that the user 5 views the display of the mage display unit 13.

Accordingly, with regard to the third embodiment, the inverse colored image having brightness H is used so that relationship between the brightness H and brightness I of the display image is "H+I=P". In this case, the third party 6 views the screen that an image having brightness P is displayed. By changing P of each pixel, arbitrary image can be displayed on the screen.

Furthermore, the case that the canceling image is generated as the weighted sum of the inverse colored images (explained in the second embodiment) is a special case of "P=1". However, in case that P is arbitrary value, the canceling image can be generated in the same way.

(Modifications)

The main body 1 may have a shape except for that in FIG. 1. For example, all equipments having a display, such as a personal computer, a cellular-phone, a game machine, ATM or a street display, may be applied.

The glasses 2 may not have a shape of glasses. For example, another shape such as a goggle, a monocle, a contact lens, or a board shape, may be used.

The polarizing direction switching unit 15 and the polarizing filter 16 may not be positioned at a lens of the glasses 2. They may be positioned at anywhere between the output unit 13 and the user 5. For example, either of the polarizing direction switching unit 15 and the polarizing filter 16 may be combined with the output unit 13 as one body. If the polarizing direction switching unit 15 and the output unit 13 are formed as one body, a synchronizing signal is communicated with the outside. Accordingly, the synchronizing signal transmitter 3 and the synchronizing signal receiver 4 are not necessary.

By preparing another polarizing direction switching unit 15 instead of the polarizing filter 16, each polarizing direction may be controlled.

Instead of the polarizing direction switching unit 15 and the polarizing filter 16, for example, another apparatus for controlling transmission and cutting off of light, such as an optical shutter, may be used.

In the disclosed embodiments, the processing can be performed by a computer program stored in a computer-readable medium.

In the embodiments, the computer readable medium may be, for example, a magnetic disk, a flexible disk, a hard disk, an optical disk (e.g., CD-ROM, CD-R, DVD), an optical magnetic disk (e.g., MD). However, any computer readable medium, which is configured to store a computer program for causing a computer to perform the processing described above, may be used.

Furthermore, based on an indication of the program installed from the memory device to the computer, OS (operation system) operating on the computer, or MW (middle ware software), such as database management software or network, may execute one part of each processing to realize the embodiments.

Furthermore, the memory device is not limited to a device independent from the computer. By downloading a program transmitted through a LAN or the Internet, a memory device in which the program is stored is included. Furthermore, the memory device is not limited to one. In the case that the processing of the embodiments is executed by a plurality of memory devices, a plurality of memory devices may be included in the memory device.

A computer may execute each processing stage of the embodiments according to the program stored in the memory device. The computer may be one apparatus such as a personal computer or a system in which a plurality of processing apparatuses are connected through a network. Furthermore, the computer is not limited to a personal computer. Those skilled in the art will appreciate that a computer includes a processing unit in an information processor, a microcomputer, and so on. In short, the equipment and the apparatus that can execute the functions in embodiments using the program are generally called the computer.

Other embodiments of the invention will be apparent to those skilled in the art from consideration of the specification and embodiments of the invention disclosed herein. It is intended that the specification and embodiments be considered as exemplary only, with the scope and spirit of the invention being indicated by the claims.

What is claimed is:

1. An apparatus for displaying an image, comprising:

an input unit configured to input a display image of a frame;

a generation unit configured to generate an inverse colored image to cancel the display image;

a time division unit configured to divide the display image into a plurality of subfields, divide the inverse colored image into a plurality of subfields, and generate a time divisional image by disposing a display time of a subfield of the inverse colored image before and after a display time of a corresponding subfield of the display image;

an output unit configured to display the time divisional image; and a switching unit configured to transmit a light from the output unit in synchronization with display timing of the display image in a display time of the time divisional image, and cut off the light in synchronization with display timing of the inverse colored image in the display time of the time divisional image.

2. An apparatus for displaying an image, comprising:

an input unit configured to input a display image of a frame;

a first generation unit configured to generate an inverse colored image to cancel the display image;

a first time division unit configured to divide the display image into a plurality of subfields;

a second time division unit configured to calculate a weighted sum of brightness of a plurality of inverse colored images, and divide an inverse colored image having the weighted sum into a plurality of subfields;

a second generation unit configured to generate a time divisional image by mutually disposing a display time of a subfield of the display image and a display time of a corresponding subfield of the inverse colored image having the weighted sum;

an output unit configured to display the time divisional image; and a switching unit configured to transmit a light from the output unit in synchronization with display timing of the display image in a display time of the time divisional image, and cut off the light in synchronization with display timing of the inverse colored image in the display time of the time divisional image.

3. The apparatus according to claim 1, wherein a sum of brightness of each pixel of the display image and brightness of corresponding pixel of the inverse colored image is constant.

4. The apparatus according to claim 2, wherein a sum of brightness of each pixel of the display image and brightness of corresponding pixel of the inverse colored image is constant.

5. The apparatus according to claim 1, wherein the switching unit comprises a polarizing direction switching unit configured to change a polarizing direction of the time divisional image to match with the display timing, and a polarizing filter configured to switch transmission and cutting off of the light to match with the display timing.

6. The apparatus according to claim 2, wherein the switching unit comprises a polarizing direction switching unit configured to change a polarizing direction of the time divisional image to match with the display timing, and a polarizing filter configured to switch transmission and cutting off of the light to match with the display timing.

7. The apparatus according to claim 1, wherein the switching unit is an optical shutter.

8. The apparatus according to claim 2, wherein the switching unit is an optical shutter.

9. A computer implemented method for causing a computer to display an image on a screen, comprising:

inputting a display image of a frame;

generating an inverse colored image to cancel the display image;

dividing the display image into a plurality of subfields;

dividing the inverse colored image into a plurality of subfields;

generating a time divisional image by disposing a display time of a subfield of the inverse colored image before and after a display time of a corresponding subfield of the display image;

displaying the time divisional image on the screen;

transmitting a light from the screen in synchronization with display timing of the display image in a display time of the time divisional image; and cutting off the light in synchronization with display timing of the inverse colored image in the display time of the time divisional image.

10. A computer implemented method for causing a computer to display an image on a screen, comprising:

inputting a display image of a frame;

generating an inverse colored image to cancel the display image;

dividing the display image into a plurality of subfields;

calculating a weighted sum of brightness of a plurality of inverse colored images;

dividing an inverse colored image having the weighted sum into a plurality of subfields;

generating a time divisional image by mutually disposing a display time of a subfield of the display image and a display time of a corresponding subfield of the inverse colored image having the weighted sum;

displaying the time divisional image on the screen;

transmitting a light from the screen in synchronization with display timing of the display image in a display time of the time divisional image; and cutting off the light in synchronization with display timing of the inverse colored image in the display time of the time divisional image.

11. A computer program stored in a computer readable medium for causing a computer to perform a method for displaying an image on a screen, the method comprising:

inputting a display image of a frame;

generating an inverse colored image to cancel the display image;

dividing the display image into a plurality of subfields;

dividing the inverse colored image into a plurality of subfields;

generating a time divisional image by disposing a display time of a subfield of the inverse colored image before and after a display time of a corresponding subfield of the display image;

displaying the time divisional image on the screen;

transmitting a light from the screen in synchronization with display timing of the display image in a display time of the time divisional image; and cutting off the light in synchronization with display timing of the inverse colored image in the display time of the time divisional image.

12. A computer program stored in a computer readable medium for causing a computer to perform a method for displaying an image on a screen, the method comprising:

inputting a display image of a frame;

generating an inverse colored image to cancel the display image;

dividing the display image into a plurality of subfields;

calculating a weighted sum of brightness of a plurality of inverse colored images;

dividing an inverse colored image having the weighted sum into a plurality of subfields;

generating a time divisional image by mutually disposing a display time of a subfield of the display image and a display time of a corresponding subfield of the inverse colored image having the weighted sum;

displaying the time divisional image on the screen;

transmitting a light from the screen in synchronization with display timing of the display image in a display time of the time divisional image; and cutting off the light in synchronization with display timing of the inverse colored image in the display time of the time divisional image.

* * * * *